Feb. 14, 1956 A. V. BEDFORD 2,735,010

STABILIZING BLOCKING OSCILLATOR CIRCUITS

Filed Oct. 12, 1950

INVENTOR
ALDA V. BEDFORD
BY
Olin U. Mitchell
ATTORNEY

United States Patent Office 2,735,010

Patented Feb. 14, 1956

2,735,010

STABILIZING BLOCKING OSCILLATOR CIRCUITS

Alda V. Bedford, Princeton, N. J., assignor to Radio Corporation of America, a corporation of Delaware Application October 12, 1950, Serial No. 189,747

3 Claims. (Cl. 250—36)

This invention relates to oscillation generators and in particular it relates to oscillation generators of the type which may easily be adapted to provide sweep voltages for television kinescopes.

In general it is desirable to reduce the number of controls necessary to provide proper operation of a television receiver. Thus, if certain variable control devices might be eliminated from a television receiver system, not only would ease of operation be afforded, but manufacturing costs would be decreased. In particular it would be desirable to eliminate horizontal and vertical oscillator holding control devices such as are commonly found on television receivers. This has been difficult to do, however, since most oscillators of the type used in the television sweep circuits are not inherently stable enough to keep the sweep circuits in step with the transmitted synchronization signals without an unduly large synchronization pulse.

Many complicated prior art devices have been used to afford stabilized blocking oscillator circuits. However, in general, these circuits have hereinbefore been too expensive for commercial use or they have not stabilized both the oscillator frequency and amplitude to such a point that the sweep circuit holding or locking controls may be eliminated when the oscillators are used as sweep generators.

It is therefore an object of the invention to provide stabilized blocking oscillator circuits well adapted for use in sweep generator circuits and wherein the oscillation frequency and amplitude remains constant enough to eliminate conventional variable oscillator control devices.

It is also desirable to provide a system which is inexpensive to manufacture. Thus, elimination of oscillator holding controls and locking adjustment devices with their respective circuit elements would simplify a television receiver if the stabilization circuit, of itself, does not require components which are expensive to manufacture. However, even should the stabilized oscillator or sweep generator circuit cost more than the former unstabilized oscillators, it is still desirable to simplify the number of variable controls necessary in the circuit and an improved television system would result thereby.

Therefore it is another object of the invention to provide simplified and improved blocking oscillator circuits which do not require frequency determining control elements such as holding controls and locking adjustment devices.

A stabilized oscillator of the type required to eliminate the frequency control adjustments should be of the blocking oscillator, relaxation oscillator or multivibrator type usually used in kinescope sweep circuits. This is true not only because a waveform of the proper shape may easily be attained therefrom, but because such oscillators may easily be synchronized with an incoming transmission signal.

It is therefore another object of the invention to provide improved blocking oscillator circuits particularly adapted for use in kinescope sweep circuits.

The frequency stability of blocking oscillators generally varies with changes in tube voltages, tube plate resistance or other variable circuit conditions. Changes in these characteristics cause a change in the effective discharge time of the frequency-determining circuit included in the oscillators.

It is therefore a further object of the invention to provide both means and methods of improving oscillator circuits wherein the effective discharge time of the frequency-determining circuit remains essentially constant under variable circuit conditions, thus affording stable oscillation frequency.

It is a still further object of the invention to provide improved and stable oscillator circuits capable of general application, yet which are particularly adapted for use in television sweep generator circuits.

Therefore, in accordance with the invention there is provided an electronic oscillator circuit, including a frequency determining circuit having a blocking capacitor, means for establishing a precise uniform charge upon the capacitor of a first predetermined level relative to the anode supply voltage, a discharge circuit and means for reestablishing the uniform charge when the capacity discharges to a second predetermined level relative to the anode supply voltage. Thus, a fixed capacitor discharge time is afforded, resulting in stability of oscillation and output amplitude level. Stability, in such a system, is determined almost entirely by the tolerances of circuit elements in the discharging circuits and is not seriously dependent upon tube characteristics or other variable circuit conditions.

For a better understanding of the invention, together with further objects thereof, the following description may be considered in connection with the accompanying drawing, wherein.

Figure 1:
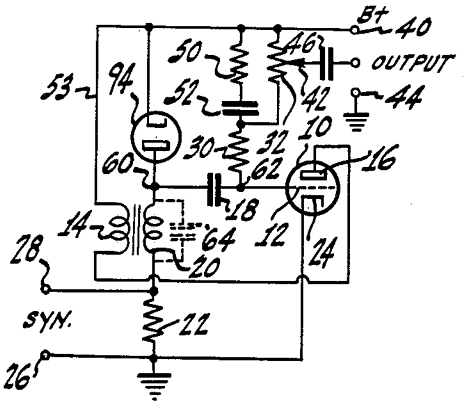
Figure 1 is a schematic diagram of a blocking oscillator circuit embodying the invention.

The blocking oscillator of the invention, as shown in Figure 1, comprises an electronic oscillator tube 10, the grid or control electrode 12 of which is intermittently or cyclically driven highly positive by energy transformed from the tube anode or plate circuit. Thus, a transformer primary winding 14 is connected in circuit with the anode 16 to supply energy from the secondary winding 20 to the control electrode 12 by medium of a blocking capacitor 18, or other electron storage device. The blocking capacitor 18 is serially connected with the control electrode 12, the transformer secondary winding 20 and a grounded resistor 22, thus completing the tube input circuit, since the tube cathode 24 is connected to ground. A synchronization signal may be connected to terminals 26 and 28 across the resistor 22 to develop a synchronization voltage pulse which may determine in part the frequency of the blocking oscillator.

When no synchronization signal is present the oscillator is free running. The free running oscillation frequency is dependent upon a frequency determining circuit including the blocking capacitor 18 and a resistive discharge path therefor. The discharge path comprises resistors 30 and 32 connected from the control electrode 12 to the +B anode supply terminal 40. The discharge path also includes the +B supply, resistor 22 and transformer secondary winding 20, but these have relatively low impedance and can be ignored in future references to the discharge process.

In this description and the appended claims the terms "charge" and "discharge" are used respectively to indicate relative changes of the voltage across a capacitor in opposite directions, without regard to the absolute polarity, or whether the voltage of the capacitor is increasing or decreasing. This is a valid conception since the charging and discharging processes thus defined are not affected by fixed components of the voltage across the capacitor such as may be caused by bias or +B voltages.

Output voltage may be taken from the grid resistor 32, which has a variable tap 42 and is coupled to one of the signal output terminals 44 by means of a capacitor 46. The other output terminal 44 may be at ground or the low potential reference point. Across the grid resistor 32 a network comprising a series resistor 50 and a capacitor 52 is connected, if desired, to provide a modified waveform output from the oscillator, as will be hereinafter described in greater detail.

Operation of the oscillator circuit may be explained by assuming that to begin with the oscillator tube 10 is nonconductive, or is cut off by a charge on the blocking capacitor 18 such that the control electrode 12 is negative with respect to the cathode 24. This charge leaks off through resistors 30 and 32 until the tube starts to conduct anode current. As the anode current increases, a positive voltage is induced at both terminals 60 and 62 of the blocking capacitor 18. The flow of plate current therefore increases at a rate of increase which is limited by the distributed capacity 64 of the transformer secondary 20.

As soon as the control electrode 12 has become positive with respect to the cathode 24, a current flows from the control electrode 12 to the cathode 24 and charges the blocking capacitor 18, with the grid terminal 62 of the capacitor 18 becoming negative with respect to the remaining terminal 60. Thus, the grid-cathode path of the tube in effect becomes a polarized conducting means for limiting the potential swing of the capacitor terminal 62 to that of the low-potential reference point or ground.

When the oscillator tube anode current reaches saturation and stops increasing, positive voltage is no longer induced at the blocking capacitor terminal 60. Therefore, the control electrode voltage is displaced in a negative direction because of the charge on the blocking capacitor 18 which, at the time the transformer voltage is zero or becomes small, has in effect one terminal 60 grounded by the resistor 22. This reduces the anode current and causes a corresponding negative voltage across the transformer secondary 20 which is in turn induced at the control electrode 12, so that the oscillator tube 10 is quickly cut off. Then no further voltage is induced at the control electrode terminal 62 of the blocking capacitor 18, and the highly negative charge on the blocking capacitor 18 holds the tube at cut off until a large portion of the charge leaks off through resistors 30 and 32. After a relatively long discharge time, the capacitor becomes discharged, the tube 10 conducts and the cycle then repeats itself.

The natural period of the oscillator is determined for the most part by the time period required for the charge on the blocking capacitor 18 to leak off to a fixed value corresponding to the cut off voltage of the oscillator tube 10. In accordance with well known theory, the time required for the charge to leak off to the fixed value depends not only upon the size of the resistors 30 and 32 and the size of the blocking capacitor 18, but also upon the magnitude of the charge or voltage put on the blocking capacitor 18 during the charging interval, or at the time the conduction of the oscillator tube 10 is increasing. This, in turn, depends upon the mutual conductance and plate impedance of the tube. Since these so called tube constants vary with heater current, anode voltage, the age of the tube and other variable circuit conditions, the oscillator frequency is usually quite unstable. However, the present invention is directed toward means for correcting this unstable condition.

Positive synchronizing pulses superimposed upon the voltage of the control electrode 12 by way of the blocking capacitor 18 just before the grid voltage has reached the cut-off value by the natural discharge action will allow the oscillator tube to conduct sooner than otherwise. Therefore a low-amplitude synchronizing signal having a frequency slightly greater than that of the natural period of the oscillator will initiate the charging periods and determine the oscillation frequency in a manner that will not disturb the improved stability characteristics of the oscillator circuit of this invention.

Figures 2, 3:
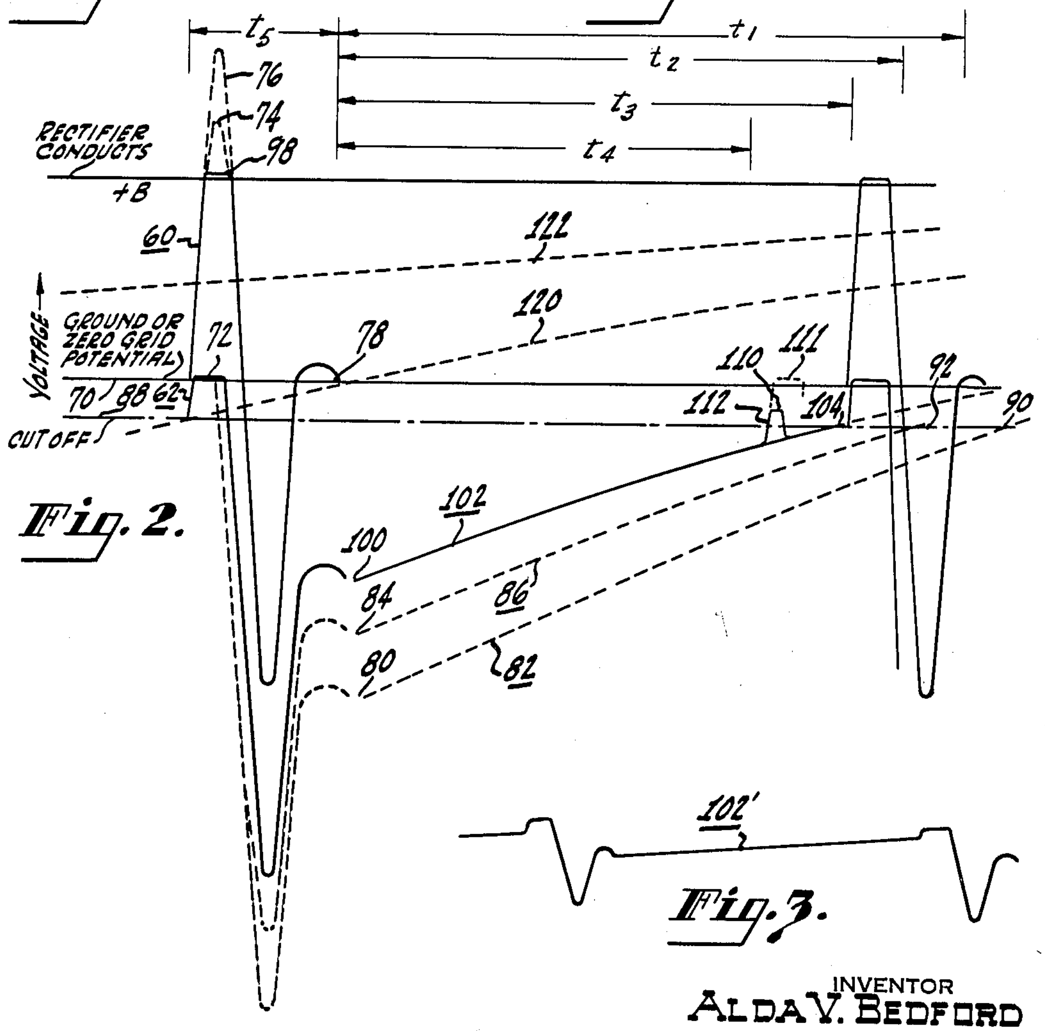
Figure 2 is a graph showing voltage waveforms at different circuit connections to illustrate the operation of the invention.
Figure 3 is a graph showing an improved waveform in connection with one embodiment of the invention; and, Figure 4 is a schematic diagram of a further blocking oscillator circuit embodying the invention.

Operation of the oscillator circuit may be more clearly understood by referring to Figure 2, in which curves 60 and 62 represent the voltage wave forms at corresponding points in the circuit of Figure 1. When the voltage across the transformer secondary winding 20 and therefore the voltage at the blocking capacitor terminal 60 swings quickly positive, the voltage at the opposite terminal 62 rises in a similar manner until the control electrode 12 becomes positive with respect to the cathode 24.

The line 70 of the graph represents zero grid potential. At this point the cathode-to-grid tube current loads the circuit so that the grid voltage goes only slightly positive with respect to the cathode voltage as shown by the flattening of the wave 62 at its crest 72. The grid-to-cathode discharge path of the electron tube 10 therefore acts as an effective rectifier, which establishes upon terminal 62 of the blocking capacitor, during the time in which grid current flows, a potential which is near the cathode reference potential. This is desirable and is pertinent to an understanding of the invention as will hereinafter be explained.

If the diode 94 is considered removed for the present, the voltage across the secondary 20 of the transformer and at terminal 60 will proceed upward to some high positive peak value as indicated by the curve 76, depending upon the amount of amplification of the electron oscillator tube 10. However, the voltage at terminal 62 will remain very close to ground potential as indicated by the flattened crest portion of the wave form 72. Then the blocking capacitor 18 is charged up to a voltage which is the difference between the peak 76 and ground or zero grid potential 70.

As before explained, when the tube current reaches saturation, the voltage across the transformer secondary 20 drops and eventually reaches a value corresponding to zero potential at the time shown by point 78 in the graph. At this point the grid current has stopped flowing, and the voltage at the control electrode 12 has been displaced to a negative potential far below the cut-off level corresponding to point 80 on curve 82, which is a continuation of curve 62.

If for some reason the oscillator or amplifier tube becomes weaker or has lower amplification, the peak voltage across the transformer might go only to a lower peak value than before, as indicated by the curve 74. Then, when the grid current flow stops, the voltage at the grid will drop to a different value as shown by the point 84 on the curve 86. Therefore discharge of the blocking capacitor 18 through the discharge resistors 30 and 32 will cause the voltage at the grid 12 to reach the cut-off level 88 at either points 90 or 92 depending upon the variable circuit conditions. This corresponds to discharge times of $t_1$ or $t_2$, respectively, depending upon the peak voltage across the transformer secondary 20 illustrated by the peaks of the charging potential 76 and 74.

Since a succeeding cycle is intiated as the oscillator tube anode current begins to flow, or as the grid reaches cut-off potential 88, it is seen that the frequency of the oscillator will be dependent upon tube characteristics or other variable circuit conditions. Thus, an unstable oscillation frequency would result unless the discharge time of the blocking capacitor 18 is maintained constant.

As before mentioned, it is known that the discharge time $t$ of a capacitor having a fixed discharge path may be maintained constant by providing a precise uniform charge level thereupon. This may be done in a dynamically active system as that shown by fixing the potential upon each terminal of the capacitor at a predetermined value during a portion of each charging interval of the capacitor.

The diode rectifier 94 (Figure 1) is provided for establishing the terminal 60 of the capacitor 18 at a potential very close to B potential during the portion of the charging period at which the peak of the charging voltage 74 or 76 would be greater than the B value. The available charging voltage exceeds B because of the step-up transformation in the anode circuit of the oscillator tube 10. It is important that the charging voltage has an amplitude large enough to tend to develop across the blocking capacitor 18 a voltage greater than B, or greater than any other predetermined level at which it is desirable to charge the blocking capacitor 18. The diode rectifier 94 therefore acts as a limiter in a manner similar to that of the grid-to-cathode discharge path of the oscillator tube 10 to fix the potential at one capacitor terminal. Suitable impedance to get good limiting action is provided in the charging circuit by the winding 20 and resistance 22.

Therefore in accordance with the invention, the potential upon each terminal of the blocking capacitor is fixed at a predetermined reference potential during each charging period, thereby providing a precise uniform charge level upon the capacitor and affording a stable oscillation frequency.

It is easily recognized from the foregoing discussion that, is order to enable stability of both oscillation frequency and amplitude, the potential upon both sides of the capacitor must be fixed at a predetermined fixed reference potential during the portion of the charging time periods at which maximum charge is developed on the capacitor. Thus the potential across the capacitor 18 is limited by the diode rectifier 94 to a value 98 corresponding to the B potential, as long as the charging voltage has an amplitude larger than the B level. Then the blocking capacitor 18 is always discharged from a potential corresponding to the point 100 along the curve 102 to a potential of cut-off at point 104, thus establishing a stable natural period of oscillation proportional to the time $t_3$ and a constant amplitude discharge wave, providing the B supply is stabilized. The discharging time $t_3$ is generally very long as compared with the charging time $t_5$. In the drawing, however, the time axis of the graph is not drawn to scale, since the present arrangement is better suited for a clear understanding of the invention.

The oscillator tube 10 is preferably of a high mu type having low cut-off voltage so that a large percentage of variation of the tube mu, due to changing voltages, and the like, will not change the cut-off level appreciably in volts. This will contribute to a more stable oscillation period as will be hereinafter explained.

It is easily recognized that a signal voltage or synchronization pulse 110 may be superimposed upon the grid 62, or otherwise upon the voltage across the blocking capacitor 18 to cause the tube to conduct at an earlier time, such as shown at point 112, without disturbing the stability characteristics of the oscillator circuit. The synchronization pulse frequency, however, should be greater than that of the natural period of the oscillator so that the time $t_4$ will be precisely determined upon the occurrence of each succeeding cycle. Each synchronization pulse 110 initiates the succeeding cycle as shown in part by the dotted line extension 111.

It is evident that if the synchronization pulse 110 had sufficient amplitude it could drive the grid to the cut-off level 88 even though the oscillator free-running period became much longer as illustrated by curve 82 for example. However, the use of stronger synchronizing pulses is not a satisfactory substitute for a stable oscillator, because in the case of television, there are spurious noise pulses in the synchronizing signal. These spurious pulses can cause premature spurious triggering of the oscillator if the amplitude is made strong enough to insure triggering in case the free-running oscillator period becomes very long.

In accordance with known theory, the time $t_3$, corresponding to the natural period of oscillation, will be as constant as the tolerances of circuit elements in the charging and discharging circuits while the voltage, to which the blocking capacitor is charged, remains constant. Therefore the resulting oscillations have a frequency and amplitude stability, which is independent from variable circuit conditions.

The discharge is conventionally of a logarithmic character, which if not interrupted by triggering at the point 112 or 104, would be as shown by the extended dotted curve portions 120 and 122, corresponding to the completion of the blocking capacitor discharge wave of preceding cycles. These curves asymptotically approach the B level because the grid 12 is connected to the B source. However, triggering occurs in each cycle when the discharge has gone only a fixed percentage of the way. This causes more stable operation of the oscillator since the discharge curve crosses the cut-off level steeply. On the other hand, if the capacitor discharge were to ground, the asymptotic curve would almost parallel the cut-off level, and a small change in the tube cut-off characteristics would make a large change in the normal oscillation period $t_3$.

In the present case, if the B voltage were changed to a new value, $n$ times the old value, the voltage difference from the grid voltage at the start of the capacitor discharge to the cut-off voltage of the tube 10 would change in essentially the same proportion $n$. The triggering, therefore, would still occur when the discharge had gone substantially the same percentage of the way to completion. Therefore the discharge time is a function only of the RC time constant of the circuit, rather than the amplitude of the voltage source, so that in this case the frequency of oscillation would remain constant even though the amplitude of the B source would change. It is noted that the total charge on the capacitor would be changed if the B potential varies, and the output amplitude would not remain entirely constant under this condition. However, the frequency still remains constant.

The cut-off voltage of the tube would generally be only approximately proportional to the B potential. However, according to the invention, the error from this source is reduced by having the condenser discharge to B instead of ground potential. Therefore the relatively small shift of the position of the cut-off level will not greatly affect the time of triggering because of the discharge wave steepness at the cut-off level.

The discharge filter circuit comprising resistor 50 and series capacitor 52, connected in shunt with the discharge resistor 32, is used to straighten the discharge wave output 102' as shown in Figure 3. This part of the circuit does not affect frequency stability of the circuit. However, it is desirable whenever the present oscillator is used for kinescope sweep circuits, or in other applications where a linear discharge is desired at the output terminals 44. Other output connections than shown may be made if desired. Thus a similar output impedance network might be used in the lead 53 if desired, rather than where shown.

Synchronization signals may be applied at any position in the circuit which will cause the superposition of the synchronization voltage pulses upon the grid 12. The synchronization signal is preferably inserted across the terminals 26 to 28 to develop a voltage across the resistor 22 as shown in Figure 1. The resistor 22 is connected in series with the blocking capacitor and transformer winding secondary 20 to ground. Thus it performs the additional function of effectively establishing the blocking capacitor terminal 60 at ground potential during the relatively long discharging intervals when voltage is not developed across the secondary transformer winding 20, and causing the voltage at terminal 60 to drop. This causes the oscillator tube 10 to be quickly cut off when the anode current of the oscillator tube 10 reaches saturation and the voltage across the transformer secondary 20 disappears.

Figure 4:
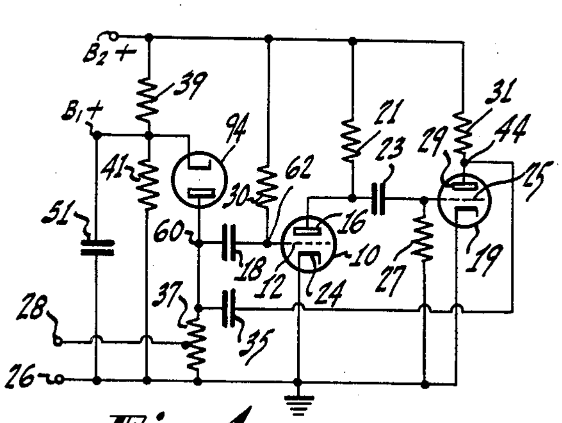

The circuit of Figure 4 shows an embodiment of the invention in which the transformer has been replaced by cyclic driving means for the capacitor 18 comprising a driving amplifier tube 19 and associated circuits. The oscillator then becomes a multivibrator type of blocking oscillator and the two tubes conduct and block in turn like other multivibrators of the well known type.

The amplifier tube 10 has an output circuit, comprising the anode load resistor 21, the blocking and coupling capacitor 23, and the grid leak resistor 27, for providing input signals to the grid 25 of the driving amplifier tube 19. This driving tube 19 has an output circuit, comprising an anode resistor 31 and a coupling capacitor 35, which in turn provide a signal to initiate conduction of the amplifier tube 10 by medium of charging the blocking and coupling capacitor 18.

Both anode load resistors 21 and 31 are connected to a terminal $B_2$ which is supplied with a suitable positive voltage by batteries or other means not shown. A voltage divider comprising of two series resistors 39 and 41 are connected from $B_2$ to ground to provide a second source of potential $B_1$ which bears a substantially fixed relation to the potential $B_2$. A capacitor 51 shunts the resistor 41 to provide thereacross a substantially constant voltage drop $B_2$.

It will be noted that the circuit is essentially a two-stage amplifier with the output circuit connected to the input circuit. The gain around the loop is far greater than unity and there is no net change of polarity of amplification in the two stages, so that the conditions for vigorous oscillation is present. The constants of the circuit elements are chosen so that operation as a multivibrator is obtained and a rectangular wave is generated at output terminal 44 of the driver stage 29 of a relatively short time compared to that of the amplifier 10. Otherwise the operation of each of the two tubes is the same in that when the first tube is blocked off, the other tube is conducting and vice versa, as will be later explained.

Assume that at a given time the first tube 10 is held at cut-off by a charge on the blocking capacitor 18 of such polarity that the grid-connected terminal 62 is negative. The output voltage of the tube 10 has then swung positive so that the grid of the succeeding tube 19 is positive, thus passing electrons and causing the blocking capacitor 23 of the driver stage to collect a charge with its anode-connected end becoming positive. During this interval the driver tube 19 is conducting so that its output circuit including terminal 44 has swung to its least positive or relatively negative condition.

At this time the blocking capacitor 18 of the first amplifier is held negative at terminal 60 by coupling through capacitor 35, and the grid 12 of the first tube 10 is also held negative by coupling through the blocking condenser 18. The driving tube 19, which has a short conduction time, then eventually causes the relative charge on the blocking capacitor 18 to saturate and leak off, because of current through resistor 30. The first tube 10 then begins to conduct slightly, making its anode circuit swing in a negative direction and accordingly making the anode circuit of the succeeding driver tube 19 swing in a positive direction to cut off. By coupling through capacitors 35 and 18 the grid of the first tube 10 is pushed by this voltage swing further in the positive direction until full conduction of the amplifier tube 10 occurs and the driver tube 19 is more than cut off because of the accumulated charge on blocking capacitor 23.

During this time blocking capacitor 18 is accumulating a charge by electrons flowing from the grid of the amplifier tube 10. Eventually the relative charge on capacitor 23 of the driving tube 19 again leaks off through resistor 21 so that the driver tube 19 again begins to conduct. The output of the tube then becomes negative and the changing voltage returns the amplifier tube 10 to cut off, as at the beginning of this explanation.

The total period of the oscillator, the reciprocal of which is the frequency, is therefore the sum of the time interval during which the two tubes are successively non-conductive. In this circuit the time of blocking of the amplifier tube 10 is accurately controlled by diode 94 just as described for the corresponding tube 10 and diode 94 in Fig. 1.

The blocking interval of the driver tube 19 need not be accurately controlled, but obviously the circuit between the anode of the amplifier tube 10 and the grid of the driver tube 19 may be made the same as the circuit shown between the anode of the driver tube 19 and the grid of the amplifier tube 10, if a higher degree of frequency stability is desirable. Since only the blocking interval of the amplifier tube 10 is accurately controlled it is preferred that the constants be chosen such that the blocking interval of tube 19 is shorter than that of tube 10 whereby a reasonable percentage of variation will not greatly affect the period of the oscillator. Also this is desirable when producing a sawtooth or sweep voltage.

Thus it is seen that the embodiment of Figure 4 operates in a manner like that of the embodiment shown in Figure 1, since the blocking capacitor 18 is charged in accordance with a cyclically reoccurring signal, and the potential of each capacitor terminal is maintained constant at a fixed reference potential during a portion of the charging period. Likewise the charging potential of the blocking capacitor is quickly cut off, while the capacitor potential is maintained constant by the rectifier 94, and the capacitor is discharged through the fixed discharge path including the grid resistor 30, which is connected to $B_2$ potential. Potential $B_1$ has a fixed ratio to potential $B_2$. There is therefore provided an output signal of both high amplitude stability and high frequency stability.

It is to be noted that the blocking capacitor charge is determined by the stabilized $B_1$ potential rather than the $B_2$ potential, thus affording an essentially constant charging potential different than the tube anode potential supply. The filter capacitor 51, or other suitable voltage regulating device, connected across the $B_1$ potential terminals thus provides a more constant charge upon the blocking capacitor 18 than would otherwise be possible, and further causes the oscillator frequency to remain independent from the amplitude of the voltage source.

In a laboratory test the comparison of frequency stability of an ordinary blocking oscillator with that of the improved blocking oscillator of this invention, having both terminals of the blocking capacitor fixed at a constant reference potential during the charging cycle, it was found that the improved circuit had more than ten fold better stability during changes in circuit voltages and tube characteristics.

There is therefore provided in accordance with the invention, an oscillator circuit providing a stable oscillation frequency. The oscillator frequency is essentially determined only by the discharge time constant of a blocking capacitor and fixed discharge means. Stabilization is accomplished in this improved oscillator circuit by establishing a fixed uniform charge level upon both terminals of the blocking capacitor.

There is hereinbefore contained a full and complete description of the invention and its mode of operation, which may suggest to those skilled in the art certain modifications which will not necessarily depart from the invention as defined in the appended claims.

What is claimed is:

1. In a frequency stabilized time constant controlled oscillator, the combination of: an electronic oscillator tube having at least an anode, a cathode and control electrode; a capacitor having a first and second terminal, said second terminal being directly and galvanically connected with said control electrode; power supply means supplying a source of substantially fixed anode power supply having at least a positive terminal and a negative reference terminal, the value of all potentials supplied by said power supply means being subject to fortuitous variation relative to said reference terminal; a galvanic connection between said cathode and said negative terminal; load means connected between said anode and said positive power supply terminal; diode means having an anode and a cathode, said diode anode being galvanically connected to said capacitor first terminal and said diode cathode to a fixed positive potential on said power supply; signal translation means connected between said load means and the first terminal of said capacitor such to capacitively apply a translated version of the signal developed by said load means in regenerative relation to said control electrode with an amplitude sufficient to produce periodic conduction in said diode means; and resistance means galvanically connected between said control electrode and a fixed positive potential on said power supply, the value of said resistance means being fixed relative to the value of said capacitor to produce a time constant value in the range corresponding to the period of the desired oscillator operating frequency.

2. In a frequency stabilized time constant controlled oscillator, the combination of: an electronic oscillator tube having at least an anode, a cathode and control electrode; a capacitor having a first and second terminal, said second terminal being directly and galvanically connected with said control electrode; power supply means supplying a source of substantially fixed anode power supply having at least a positive terminal and a negative reference terminal, the value of all potentials supplied by said power supply means being subject to fortuitous variation relative to said reference terminal; a galvanic connection between said cathode and said negative terminal; a blocking oscillator transformer having a primary and secondary winding; means connecting said primary winding between said anode and said positive power supply terminal; circuit means connecting said secondary winding in blocking oscillation producing relation between said cathode and said capacitor first terminal; diode means having an anode and a cathode, said diode anode being galvanically connected to said capacitor first terminal and said diode cathode to a fixed positive potential on said power supply; and resistance means galvanically connected between said control electrode and a fixed positive potential on said power supply, the value of said resistance means being fixed relative to the value of said capacitor to produce a time constant value in the range corresponding to the period of the desired oscillator operating frequency.

3. In a frequency stabilized time constant controlled oscillator, the combination of: an electronic oscillator tube having at least an anode, a cathode and control electrode; a capacitor having a first and second terminal, said second terminal being directly and galvanically connected with said control electrode; power supply means supplying a source of substantially fixed anode power supply having at least a positive terminal and a negative reference terminal, the value of all potentials supplied by said power supply means being subject to fortuitous variation relative to said reference terminal; a galvanic connection between said cathode and said negative terminal; load means connected between said anode and said positive power supply terminal; diode means having an anode and a cathode, said diode anode being galvanically connected to said capacitor first terminal and said diode cathode to a fixed positive potential on said power supply; a signal phase inverting amplifier device having its input circuit coupled with said load means and its output circuit capacitively coupled with the first terminal of said capacitor such to capacitively apply through said capacitor a regenerative version of the signal developed by said load means to said control electrode with an amplitude sufficient to produce periodic conduction in said diode means; and resistance means galvanically connected between said control electrode and a fixed positive potential on said power supply, the value of said resistance means being fixed relative to the value of said capacitor to produce a time constant value in the range corresponding to the period of the desired oscillator operating frequency.

References Cited in the file of this patent

UNITED STATES PATENTS

| | | |
|---|---|---|
| 1,919,985 | Patterson | July 25, 1933 |
| 2,159,792 | Geiger | May 23, 1939 |
| 2,193,868 | Geiger | Mar. 19, 1940 |
| 2,227,075 | Geiger | Dec. 31, 1940 |
| 2,282,895 | Shepard | May 12, 1942 |
| 2,358,297 | Bedford | Sept. 19, 1944 |
| 2,468,420 | Wendt | Apr. 26, 1949 |
| 2,547,987 | Vestal, Jr. | Apr. 10, 1951 |
| 2,573,284 | Shaw | Oct. 30, 1951 |
| 2,609,507 | Schlesinger | Sept. 2, 1952 |

FOREIGN PATENTS

| | | |
|---|---|---|
| 630,219 | Great Britain | Oct. 7, 1949 |